(12) United States Patent
Fitzsimmons et al.

(10) Patent No.: US 7,517,790 B2
(45) Date of Patent: Apr. 14, 2009

(54) METHOD AND STRUCTURE TO ENHANCE TEMPERATURE/HUMIDITY/BIAS PERFORMANCE OF SEMICONDUCTOR DEVICES BY SURFACE MODIFICATION

(75) Inventors: John A. Fitzsimmons, Poughkeepsie, NY (US); Stephen M. Gates, Ossining, NY (US); Michael W. Lane, Yorktown Heights, NY (US); Eric G. Liniger, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 10/906,189

(22) Filed: Feb. 8, 2005

(65) Prior Publication Data
US 2005/0116357 A1 Jun. 2, 2005

(51) Int. Cl.
*H01L 21/44* (2006.01)
(52) U.S. Cl. .............................. 438/617; 257/E21.502; 438/127
(58) Field of Classification Search .................. 438/617
See application file for complete search history.

(56) References Cited

U.S. PATENT DOCUMENTS

| | | | | |
|---|---|---|---|---|
| 5,045,151 A | * | 9/1991 | Edell | 257/622 |
| 5,396,104 A | * | 3/1995 | Kimura | 257/784 |
| 5,639,558 A | * | 6/1997 | Tatsumi et al. | 428/458 |
| 5,656,830 A | * | 8/1997 | Zechman | 257/784 |
| 5,824,568 A | * | 10/1998 | Zechman | 438/112 |
| 5,950,100 A | * | 9/1999 | Shingai | 438/617 |
| 6,013,109 A | * | 1/2000 | Choi | 438/124 |
| 6,177,726 B1 | * | 1/2001 | Manteghi | 257/725 |
| 6,368,899 B1 | * | 4/2002 | Featherby et al. | 438/127 |
| 6,573,124 B1 | * | 6/2003 | Chou et al. | 438/126 |
| 6,852,567 B1 | * | 2/2005 | Lee et al. | 438/106 |
| 7,195,954 B2 | * | 3/2007 | Lamson et al. | 438/112 |
| 2006/0038291 A1 | * | 2/2006 | Chung et al. | 257/738 |

OTHER PUBLICATIONS

Wolf, Silicon Processing for the VLSI Era:vol. 2-Process Integration, Latttice Press, 1990, Section 4.3.2.4, p. 198.*
Tummala et al., Mircoelectronics Packaging Handbook, Part II, 2nd Edition, Chapman & Hall, 1999, pp. 474-478.*

* cited by examiner

*Primary Examiner*—David A Zarneke
(74) *Attorney, Agent, or Firm*—Cantor Colburn LLP; Lisa Jaklitsch

(57) ABSTRACT

A method is disclosed of repairing wire bond damage on semiconductor chips such as high speed semiconductor microprocessors, application specific integrated circuits (ASICs), and other high speed integrated circuit devices, particularly devices using low-K dielectric materials. The method involves surface modification using reactive liquids. In a preferred embodiment, the method comprises applying a silicon-containing liquid reagent precursor such as TEOS to the surface of the chip and allowing the liquid reagent to react with moisture to form a solid dielectric plug or film (50) to produce a barrier against moisture ingress, thereby enhancing the temperature/humidity/bias (THB) performance of such semiconductor devices.

16 Claims, 3 Drawing Sheets

METHOD AND STRUCTURE TO ENHANCE TEMPERATURE/HUMIDITY/BIAS PERFORMANCE OF SEMICONDUCTOR DEVICES BY SURFACE MODIFICATION

TECHNICAL FIELD

This invention relates generally to the manufacture of high speed semiconductor microprocessors, application specific integrated circuits (ASICs), and other high speed integrated circuit devices. More particularly, this invention relates to a method to enhance the temperature/humidity/bias (THB) performance of such semiconductor devices, particularly devices using low-k dielectric materials, by surface modification using reactive liquids.

BACKGROUND OF THE INVENTION

Metal interconnections in very large scale integrated (VLSI) or ultra-large scale integrated (ULSI) circuits typically consist of interconnect structures containing patterned layers of metal wiring. Typical integrated circuit (IC) devices contain from three to fifteen layers of metal wiring. As feature size decreases and device area density increases, the number of interconnect layers is expected to increase.

The materials and layout of these interconnect structures are preferably chosen to minimize signal propagation delays, hence maximizing the overall circuit speed. An indication of signal propagation delay within the interconnect structure is the RC time constant for each metal wiring layer, where R is the resistance of the wiring and C is the effective capacitance between a selected signal line (i.e., conductor) and the surrounding conductors in the multilevel interconnect structure. The RC time constant may be reduced by lowering the resistance of the wiring material. Copper is therefore a preferred material for IC interconnects because of its relatively low resistance. The RC time constant may also be reduced by using dielectric materials with a lower dielectric constant, k.

Many performance advantages are obtained by using a low-k dielectric material as the inter-level dielectric (ILD) for back-end-of-line (BEOL) interconnects of high speed microprocessors, application specific integrated circuits (ASICs) and related integrated circuit devices. In advanced interconnect structures, the ILD is preferably a low-k polymeric thermoset material such as SiLK™ (an aromatic hydrocarbon thermosetting polymer available from The Dow Chemical Company). Other preferable low-k dielectric materials include carbon-doped silicon dioxide (also known as silicon oxycarbide or SiCOH dielectrics); fluorine-doped silicon oxide (also known as fluorosilicate glass, or FSG); spin-on glasses; silsesquioxanes, including hydrogen silsesquioxane (HSQ), methyl silsesquioxane (MSQ) and mixtures or copolymers of HSQ and MSQ; and any silicon-containing low-k dielectric.

There are several fabrication advantages when an organic thermoset polymer is selected. The primary advantages of organic thermoset polymer dielectrics are lower dielectric constant (typically about 2.65), lower cracking rate under applied stress, and etch (RIE) selectivity. Glass dielectric materials such as SiCOH or carbon-doped oxide tend to crack under applied stress and in humid atmosphere, while organic thermoset polymers do not. Moreover, the carbon-based thermoset polymers are not etched in the RIE chemistry used to open the cap at the bottom of each via, while silicon-based SiCOH is etched in this etch step. In other words, carbon-based thermoset polymers exhibit high etch selectivity while silicon-based SiCOH exhibits low selectivity. Finally, organic thermoset polymer materials are spin applied, whereas glasses are typically applied using plasma-enhanced chemical vapor deposition (PE CVD) tools. Spin apply tools have lower cost of ownership than PE CVD tools.

However, one disadvantage is the low modulus of organic polymer or low k CVD dielectrics, which can result in defects or breaches formed in the passivation layers when the completed IC chip is electrically connected via wirebonding (or soldering) methods to an IC holder. For example, cracks may form in the passivation layers in the vicinity of bond pads. Such cracks typically have a width of 1000 angstroms to 5000 angstroms, a depth of several microns, and a length of 1 micron to 100 microns. Cracks often occur as well at the terminal insulator level of the chip. These cracks have many causes; most notable are those caused by rough handling of the finished chip prior to packaging and the damage that can result during the die wire bonding process. Delamination of the passivation layers is also a possible problem.

Although such microcracks may have been present in prior devices using conventional inorganic dielectric materials, the nature of the integration in those devices minimized the deleterious impact of such defects on product reliability. With the advent of low-k dielectrics and their inherent inferior mechanical properties with respect to inorganic oxides, an increase in sensitivity and amount of microcracking at the terminal insulator level of the chip has been observed.

In devices comprising low-k dielectric materials, the terminal insulator level of the chip is often built utilizing an inorganic oxide layer as a moisture barrier. However, this terminal inorganic oxide is more easily damaged than in devices using oxide for all inter-layer dielectric, due to the unique mechanical structure of low-k dielectric integration. Furthermore, as device ground rules continue to decrease, even without the transition to low-k dielectrics, these microcracks and delaminations are likely to become a significant source of device performance degradation if they are left unrepaired before final packaging and encapsulation.

Post wire-bond packaging and encapsulation processes are ineffective in sealing these cracks in the terminal insulator level of the chip. As a result of the lack of seal or repair of these cracks in the terminal insulator level of the chip, electrical degradation in semiconductor chip electrical performance has been observed during temperature and humidity stress testing. For example, U.S. Pat. No. 5,689,089 discloses the use of silicone-based polymers for encapsulation. However, it has been observed that such polymers alone can not provide an effective barrier to moisture ingress.

More complex schemes using new materials in the passivation layers and in the metal bond pads have been proposed. For example, the Wafer Applied Seal for PEM Protection (WASPP), sponsored by The U.S. Army Manufacturing Technology (ManTech) Program, is a high cost multi-layered approach. A spin applied material (such as hydrogen silsesquioxane, HSQ) and a PE CVD applied material (silicon carbide) are used for passivation. Also, two metal layers (gold plus titanium) are added to the bond pad. However, the use of unconventional materials and additional metal layers adds significantly to the cost of the manufacturing process.

Thus, there remains a need in the art for a low-cost method to enhance temperature/humidity/bias performance of semiconductor devices.

DISCLOSURE OF THE INVENTION

It is therefore an object the present invention to provide a method for repairing or sealing damage on semiconductor chips due to electrical connections such as wire bonds, and more generally for enhancing temperature/humidity/bias performance of semiconductor chips using a low-cost method which does not introduce unconventional materials or additional metal layers.

In one aspect, the present invention is directed to an integrated circuit chip comprising a first dielectric material at the top surface of the integrated circuit chip; electrical connections attached to the top surface of the integrated circuit chip; and a layer of a second dielectric material atop the top surface of the integrated circuit chip, wherein the second dielectric material is a silicon-containing conformal encapsulant.

In another aspect, the present invention is directed to a method for encapsulating an integrated circuit chip, the method comprising the steps of: attaching electrical connections to a top surface of an integrated circuit chip, wherein the top surface comprises a first dielectric material; depositing a second material atop the top surface of the integrated circuit chip, wherein the second material comprises a silicon-containing conformal encapsulant precursor; and treating the deposited second material to cause reaction of the precursor to form a second dielectric material.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

BEST MODE FOR CARRYING OUT THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

In one aspect, this invention is a method to repair and seal microcracks and delaminations that are found in typical damage due to wire bonds or other electrical connections. A damaged part may be, for example, an integrated circuit chip mounted on a chip carrier or interposer, in which the chip contains damage which includes microcracks, fissures, delaminations and the like within the passivation layers of the chip.

Figure 1A:
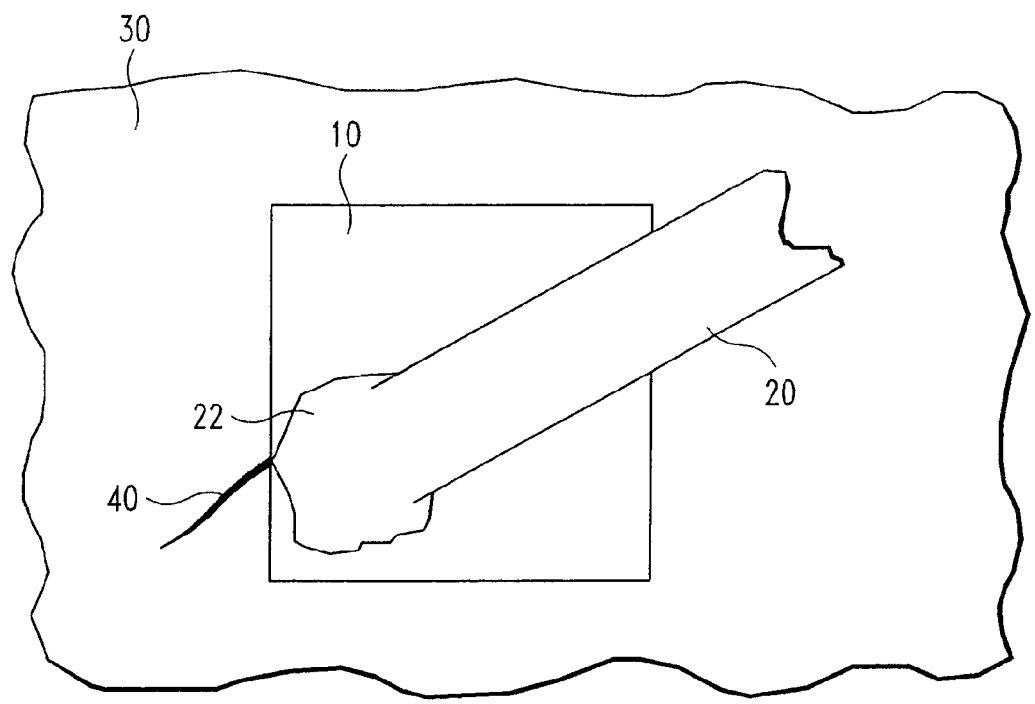
FIGS. 1A and 1B illustrate plan views of bond pads on a semiconductor chip, with a wirebond connected to the bond pad and microcracks adjacent to the wirebond.
Figure 1B:
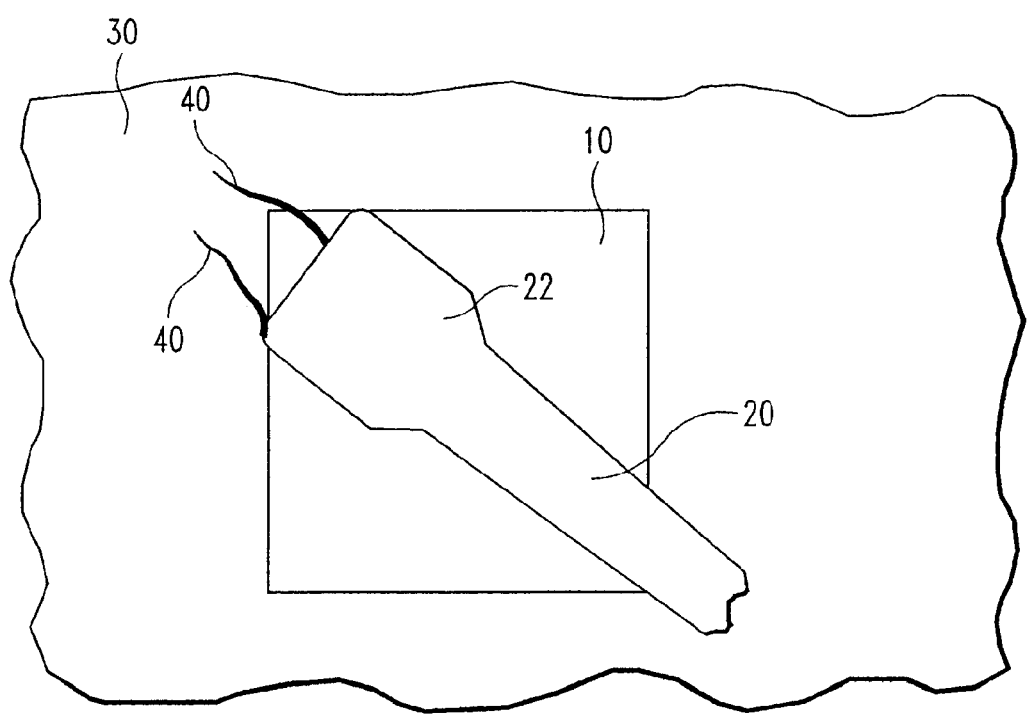

FIGS. 1A and 1B illustrate plan views of a typical bond pad on a semiconductor chip, with a wire bond attached to the bond pad. Bond pad 10 is typically formed of aluminum, but may be formed of any suitable conductive material. Dielectric material 30 surrounds bond pad 10. Wire bond 20 is attached to bond pad 10 at the end 22 thereof. In FIGS. 1A and 1B, end 22 of wire bond 20 is shown attached to bond pad 10 off-center. When the wire bond is attached to the bond pad off-center, microcracks 40 may occur in the aluminum bond pad 10 and surrounding dielectric material 30. Microcracks having a length of about 20 microns have been observed.

Figure 2A:
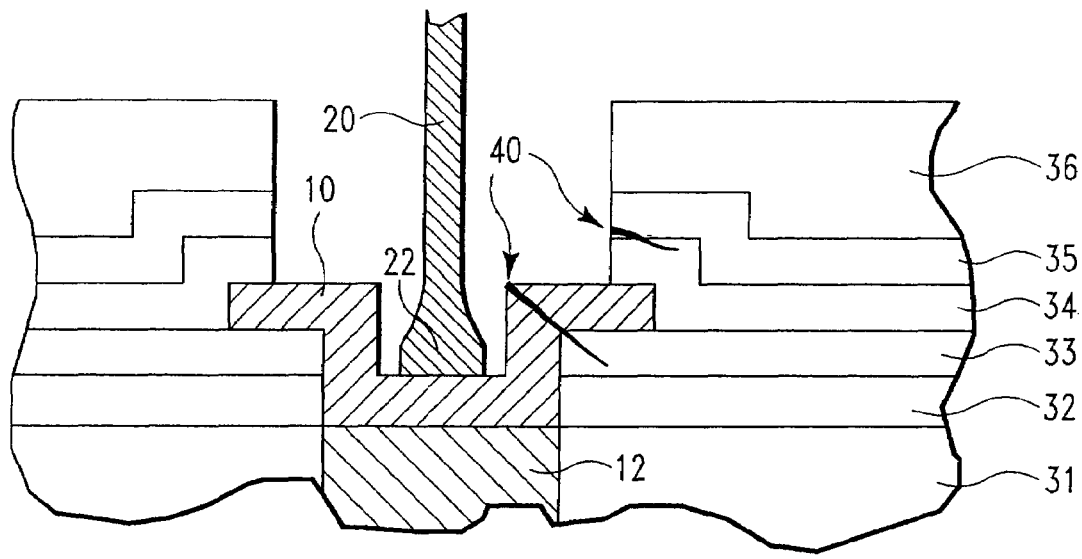
FIGS. 2A and 2B illustrate cross-sectional views of bond pads on a semiconductor chip, with a wirebond connected to the bond pad and microcracks adjacent to the wirebond.
Figure 2B:
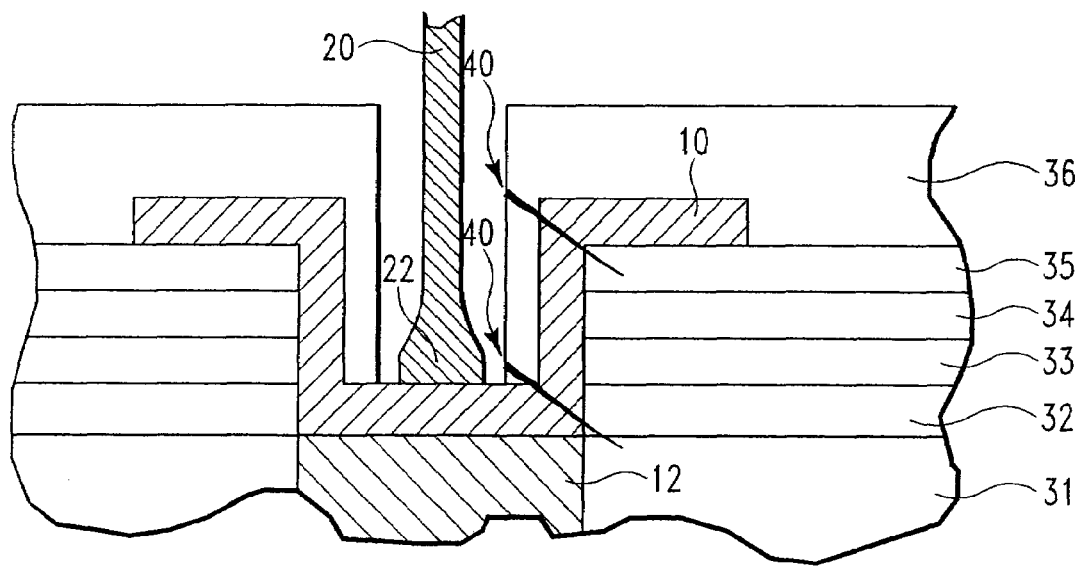

FIGS. 2A and 2B illustrate cross-sectional views of a typical bond pad on a semiconductor chip, with a wire bond attached to the bond pad. Bond pad 10, typically of aluminum, is formed over conductor 12, typically of copper. Conductor 12 is surrounded by dielectric material 31, which may be any suitable dielectric material, such as a polymeric low-k dielectric material. Dielectric 31 is typically capped with one or more dielectric layers, such as silicon dioxide ($SiO_2$) layer 32 and silicon nitride (SiN) layer 33. In FIG. 2A, bond pad 10 is shown formed over capping layers 32 and 33, and two additional capping layers 34, 35 are deposited over bond pad 10 and capping layer 33. Capping layers 34 and 35 may be the same as or different from capping layers 32 and 33. For example, capping layer 34 may be $SiO_2$ and capping layer 35 may be SiN. Above the final capping layer, a layer of protective material 36 may be deposited, such as a photosensitive polyimide material. Wire bond 20 is shown attached to bond pad 10 at its end 22. Microcracks 40 are also shown extending through the aluminum bond into the capping layers. Note that such microcracks may occur even when wire bond 20 is centered on bond pad 10. Delaminations (not shown) may also occur between or beneath any of capping layers 32, 33, 34 and 35.

FIG. 2B shows an alternative bond pad configuration, wherein bond pad 10 is formed over capping layers 32-35, and protective material 36 is deposited over the vertical sides of bond pad 10. Even with such polyimide protective material 36 covering the aluminum bond pad 10, microcracks 40 have been observed extending through protective material 36, bond pad 10 and into the underlying dielectric materials 31-35. Again, delaminations (not shown) may also occur between or beneath any of capping layers 32-35.

Figure 3A:
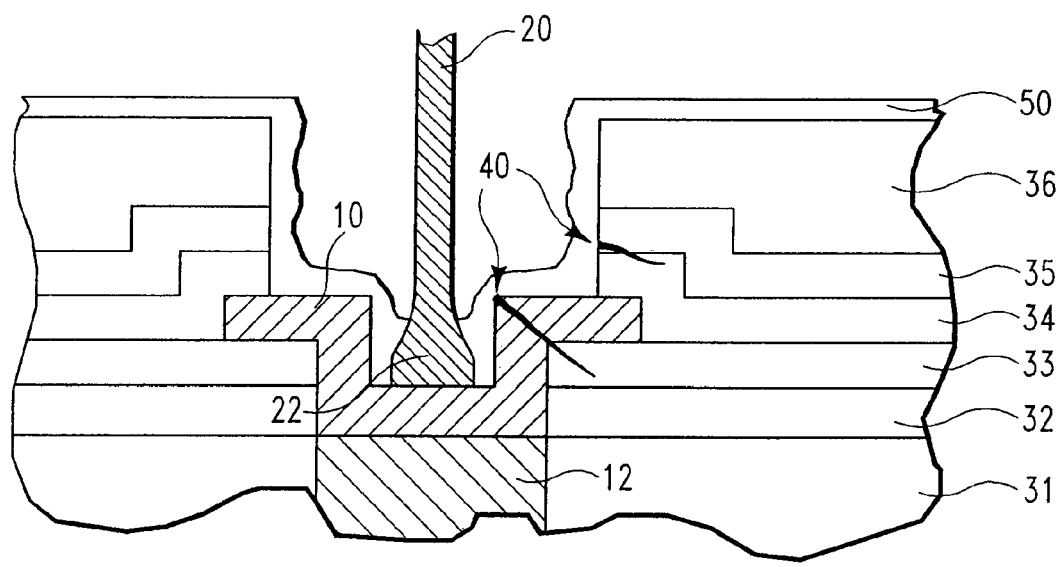
FIGS. 3A and 3B illustrate cross-sectional views of the bond pads of FIGS. 2A and 2B, with the surface modification of the present invention.
Figure 3B:
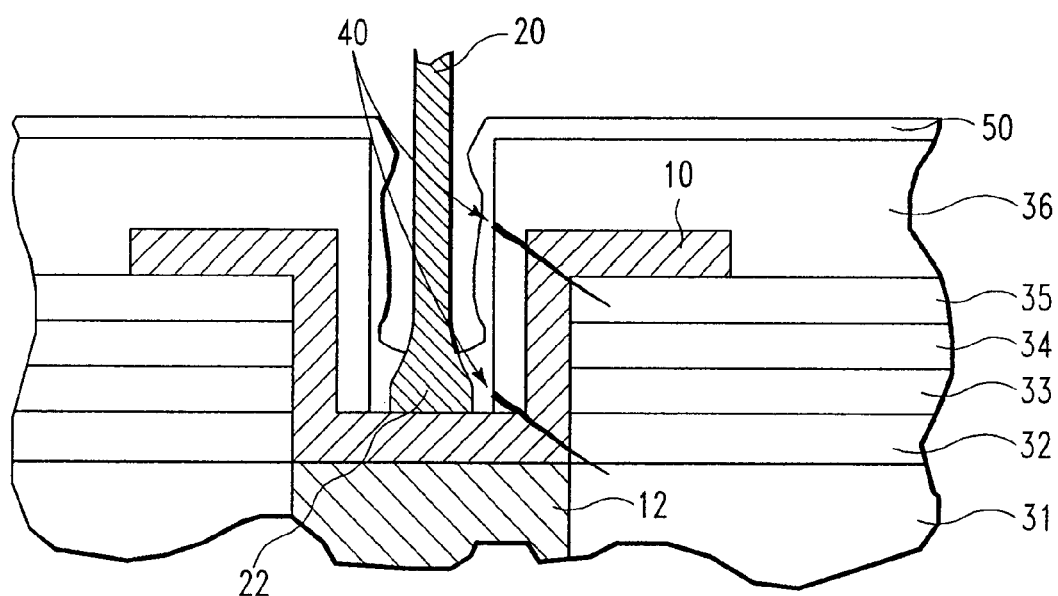

Such microcracks may be repaired or sealed using the method of this invention, which comprises applying a reactive liquid reagent to the damaged part, after bonding operations and before the post bond packaging and encapsulation process. FIGS. 3A and 3B illustrate the bond pad configurations of FIGS. 2A and 2B, with a layer of reactive liquid reagent 50 applied over the damaged semiconductor chip. The liquid reagent fills and wets the damaged areas on the chip, such as microcracks 40.

The liquid reagent may comprise one or more of the following reactive materials: alkoxy silanes, siloxanes, silazanes, epoxy-siloxanes (including alkoxy-epoxy-siloxanes), epoxy-silazanes, urea-silazanes, carbo-silazanes, urea-siloxanes, carbo-siloxanes, and other similarly reactive materials, including such compounds as TEOS (tetra ethoxysilane, tetraorthosilicate), HMDS (hexamethyidisilazane), TMCTS (tetra methyl cyclo tetra siloxane), and 3MC3S (tri methyl cyclo tri siloxane). Alternatively, the liquid reagent may comprise an inorganic polymer including polysilazanes, polyureasilazanes, polycarbosilazanes, polysiloxanes, polyureasiloxanes, polycarbosiloxanes, and related silicon-containing polymers. These polymers may be of low molecular weight and/or may be diluted with solvent to reduce the viscosity.

It is preferred that, upon exposure to moisture, the liquid reagent reacts with water, forming a solid dielectric material.

For example, TEOS may be applied to the damaged part to seal microcracks at the terminal insulator level of the chip. The TEOS reacts with moisture to form a TEOS oxide barrier against moisture ingress. It is particularly preferred that the liquid reagent reacts with moisture contamination already present in the damaged area to dehydrate or bond this moisture so that it is not detrimental to the performance of the semiconductor chip as an electrical device.

Alternatively, the liquid reagents may react with a secondary initiator to bond with the semiconductor substrate and themselves to seal damaged areas from moisture ingress. Typical secondary initiators are dependent on the type of binary system used. For moisture-activated systems, organic acids or alcohols may enhance the chemical reaction. Typical organic acids include acetic, formic and propionic acid. Typical alcohols include methyl, ethyl and isopropyl. The solution of water in an alcohol, such as 25% w/w water in methanol, may improve the performance of an alcohol or water alone as the alcohol lowers the viscosity and improves the wetting action of water while the siloxanes and silazanes are generally more reactive towards water than alcohols. Furthermore, lower molecular weight organic initiators are preferred as they are generally more reactive and have a lower viscosity.

For binary systems such as epoxy-silanes, epoxy-siloxanes and epoxy-silazanes, an oxidizer may be used, such as a solution of a peroxide (such as benzyl peroxide) in xylene or hexane. Alternatively, peroxide solutions in ethers such as diethyl ether or tetrahydrofuran (THF) may be used as the binary initiator. Peroxide solutions may also be used with moisture-activated binary systems. Since these peroxide solutions may be unstable, it is preferred that they be mixed in small volumes just before use.

While higher molecular weight hydrocarbon solvents such as mineral oil would be more stable as a solvent for peroxide solution, the higher viscosity of this solvent is a major disadvantage. Some mineral oil may be added to hexane or xylene solutions of organic peroxides such as benzyl peroxide to lower flashpoint, but lower viscosity solutions are most preferred.

Other oxidative initiators such as ozone are not to be precluded and in some cases ozone initiation may be preferred, such as when the metallurgy and package are resistant to degradation by ozone.

The liquid reagent should be a reactive, low viscosity, silicon-containing liquid precursor. Materials from the following group are effective in producing a seal and repair of microcracks at the terminal insulator level of the chip: alkoxy silanes, siloxanes, silazanes, epoxy-siloxanes (including alkoxy-epoxy-siloxanes), epoxy-silazanes, urea-silazanes, carbo-silazanes, urea-siloxanes, carbo-siloxanes, TEOS (tetra ethoxysilane, tetraorthosilicate), HMDS (hexamethyidisilazane), TMCTS (tetra methyl cyclo tetra siloxane), 3MC3S (tri methyl cyclo tri siloxane), polysilazanes, polyureasilazanes, polycarbosilazanes, polysiloxanes, polyureasiloxanes, polycarbosiloxanes, related silicon-containing polymers, and other similar materials.

The liquid reagent should have a low viscosity such that the fluid will enter and fill fine cracks or crevices, and reagent should also wet well to the terminal insulator structure of conductor and dielectric to avoid bridging or non-coating of the defective areas that are to be repaired. The liquid reagent should be able to form a chemical bond with these structures, and should be able to react to form a plug or film that produces a barrier against moisture ingress.

The liquid reagent, such as alkoxy silane or other reactive siloxanes or silazanes, should be applied to the chip with sufficient volume to fill all damaged areas. The liquid reagent may be applied only to damaged areas of the chip, or may be applied across the entire surface of the chip as shown in FIGS. 3A and 3B to encapsulate the semiconductor substrate, providing an extra barrier layer to resist moisture ingress.

Reactive reagents such as the reagents described above are particularly preferred because they produce no undesirable by-products, such as strong mineral acids or corrosive salts, during the reaction and cure of these materials. The reagents described above are also preferred because these materials are insulators or dielectric materials and therefore do not degrade the performance of the chip package interconnection.

While FIGS. 1 and 2 illustrate wire bond connections to the chip, solder ball arrays are commonly used in the industry to form high speed input/output connections to a completed chip.

The solder ball array may connect the chip to a chip carrier, interposer, or ceramic package. In an alternative embodiment of this invention, microcracks or delamination or similar damage within the passivation layers may be present after the operations of dicing, wafer level probing, or post reflow and chip attachment. In this embodiment, the liquid reagent is then applied to the chip mounted on the chip carrier, interposer, or ceramic package after the reflow and chip attachment operation. The secondary initiator may then be applied.

In a preferred embodiment, the method of repairing and sealing the damaged chip comprises subjecting the semiconductor chip to a vacuum, for example a vacuum of about $10 \times 10^{-3}$ torr, applying the liquid reagent or sealant to the chip, and subjecting the chip to a thermal and/or ultraviolet (UV) light cure. It is preferred that the chip is subjected to thermal cure, and the preferred temperature range is about 20 degrees C. below the lowest solder (braze) liquidus in the package. A most preferred temperature range is about 150 to 220 degrees C. A cure time of about 1 minute to 1 hour is preferred, with about 5 minutes to 30 minutes most preferred.

Alternatively, the chip may be subjected to UV cure. A preferred UV light source is a high pressure Hg or Xe/Hg lamp. It is most preferred that UV cure is used in conjunction with a thermal treatment at a temperature in the range of about 150 to 220 degrees C. A cure time of about 5 minutes to 30 minutes is most preferred.

In another embodiment, the method comprises subjecting the semiconductor chip to a vacuum of about $10 \times 10^{-3}$ torr, applying the liquid reagent or sealant to the chip, increasing the pressure up to about 5 atmospheres, and subjecting the chip to a thermal and/or UV light cure.

In yet another embodiment, the method comprises applying the liquid reagent or sealant at ambient pressure, and subjecting the chip to a thermal and/or UV light cure.

In yet another embodiment, the method comprises applying the liquid reagent or sealant at ambient pressure, increasing the pressure up to about 5 atmospheres, and subjecting the chip to a thermal and/or UV light cure.

In yet another embodiment, the method comprises subjecting the semiconductor chip to a vacuum of about $10 \times 10^{-3}$ torr, applying the liquid reagent or sealant to the chip, and applying a secondary initiator or chemical curing agent.

In yet another embodiment, the method comprises subjecting the semiconductor chip to a vacuum of about $10 \times 10^{-3}$ torr, applying the liquid reagent or sealant to the chip, increasing the pressure up to about 5 atmospheres, and then applying a secondary initiator or chemical curing agent.

In yet another embodiment, the method comprises applying the liquid reagent or sealant at ambient pressure, and applying a secondary initiator or chemical curing agent.

In yet another embodiment, the method comprises applying the liquid reagent or sealant at ambient pressure, increasing the pressure up to about 5 atmospheres, and applying a secondary initiator or chemical curing agent.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method for encapsulating an integrated circuit chip, the method comprising:
    attaching electrical connections to a top surface of an integrated circuit chip, wherein the top surface comprises a first dielectric material and said first dielectric material contains a microcrack;
    depositing a second material atop the top surface of said integrated circuit chip;
    increasing a pressure on the second material, which is directed toward the top surface, such that the second material is caused to enter and to fill the microcrack in the first dielectric material, wherein the second material comprises a silicon-containing conformal encapsulant precursor; and
    treating the deposited second material to cause reaction of the precursor to form a second dielectric material, said second dielectric material conformally fills said microcrack.

2. The method of claim 1, wherein said electrical connections are wire bonds.

3. The method of claim 1, wherein the second material comprises a reactive, low viscosity, silicon-containing material selected from the group consisting of alkoxy silanes, siloxanes, silazanes, epoxy-siloxanes (including alkoxy-epoxy-siloxanes), epoxy-silazanes, urea-silazanes, carbo-silazanes, urea-siloxanes, carbo-siloxanes, polysilazanes, polyureasilazanes, polycarbosilazanes, polysiloxanes, polyureasiloxanes, polycarbosiloxanes, related siliconcontaining polymers, HMDS(hexamethyldisilazane) and 3MC3S (tri methyl cyclo tri siloxane).

4. The method of claim 1, wherein the second material is treated by heating said second material.

5. The method of claim 4, wherein the second material is deposited in a vacuum, and wherein the method further comprises, prior to treating the deposited second material, the step of increasing the pressure within the vacuum.

6. The method of claim 4, wherein the second material is heated in the presence of water vapor.

7. The method of claim 1, wherein the second material further comprises a reagent.

8. The method of claim 1, wherein the second material is deposited in a vacuum.

9. The method of claim 1, further comprising, after the second material is deposited, the step of increasing the pressure to atmospheric pressure.

10. The method of claim 5, further comprising, after the second material is deposited, the step of increasing the pressure up to about 5 atmospheres.

11. The method of claim 1, wherein the integrated circuit chip contains a delamination beneath the first dielectric material, and the second dielectric material conformally fills the delamination.

12. The method of claim 1, wherein the second material reacts with any moisture contamination in said microcrack and one of dehydrates and bonds said moisture such that said moisture does not detrimentally affect performance of said integrated circuit chip.

13. The method of claim 1, wherein the second material is subjected to UV curing in conjunction with a thermal treatment.

14. The method of claim 13, wherein the second material is further subjected to a vacuum of about $10 \times 10^{-3}$ torr.

15. The method of claim 13, wherein the thermal treatment occurs within a temperature range of about 150 to 220 degrees C. and a curing time is about 5-30 minutes.

16. The method or claim 1, wherein the second material comprises a reactive, low viscosity, silicon-containing material selected from the group consisting of urea-silazanes and urea-siloxanes.

* * * * *